(12) United States Patent
Aipperspach et al.

(10) Patent No.: US 8,643,421 B1
(45) Date of Patent: Feb. 4, 2014

(54) IMPLEMENTING LOW POWER, SINGLE MASTER-SLAVE ELASTIC BUFFER

(71) Applicant: International Business Machines Corporation, Armonk, NY (US)

(72) Inventors: Anthony G. Aipperspach, Rochester, MN (US); Morgan D. Davis, Rochester, MN (US); Matthew R. Ellavsky, Rochester, MN (US); Kent H. Haselhorst, Byron, MN (US); Kerry C. Imming, Rochester, MN (US); Mark G. Veldhuizen, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/795,707

(22) Filed: Mar. 12, 2013

(51) Int. Cl.
*H03K 3/289* (2006.01)

(52) U.S. Cl.
USPC ...................................... 327/202

(58) Field of Classification Search
USPC .......... 327/199–203, 208, 210–215, 218, 219
See application file for complete search history.

(56) References Cited

U.S. PATENT DOCUMENTS

| | | | |
|---|---|---|---|
| 7,099,426 | B1 | 8/2006 | Cory et al. |
| 7,657,862 | B2 | 2/2010 | Kishinevsky et al. |
| 8,184,760 | B2 | 5/2012 | Chien et al. |
| 2009/0147888 | A1* | 6/2009 | Felix et al. .................... 375/340 |

OTHER PUBLICATIONS

Cortadella et al., "Elastic Systems", IEEE, 2010 8th IEEE/ACM International Conference, 2010, pp. 149-158. © 2010 IEEE.
Cortadella et al., "Synthesis of Synchronous Elastic Architectures", Proceedings of the 43rd Annual Design Automation Conference, ACM, Jul. 24-28, 2006, San Francisco, CA, USA. pp. 657-662. © 2006 ACM.
Grot et al., "Kilo-NOC: A Heterogeneous Network-On-Chip Architecture for Scalability and Service Guarantees". ACM SIGARCH Computer Architecture News, vol. 39, No. 3, ACM, 2011, pp. 1-12. © 2011 ACM.
Hoover et al., "Synthesizing Synchronous Elastic Flow Networks", Design, Automation and Test in Europe, Mar. 10-14, 2008, pp. 306-311. © 2008 EDAA.
Luo et al., "Hybrid Circuit-Switched NOC for Low Cost On-Chip Communication," IEEE, 2012 International Conference on Anti-Counterfeiting, Security and Identification (ASID), 5 pages. © 2012 IEEE.
Michelogiannakis et al., "Elastic-Buffer Flow Control for On-Chip Networks", IEEE Transactions on Computers, Feb. 2013. vol. 62, Issue 2, pp. 295-309.
Michelogiannakis et al., "Evaluating Elastic Buffer and Wormhole Flow Control," IEEE Transactions on Computers, vol. 60 Issue 2, 2011, pp. 896-903.

* cited by examiner

*Primary Examiner* — Lincoln Donovan
*Assistant Examiner* — Sibin Chen
(74) *Attorney, Agent, or Firm* — Joan Pennington

(57) ABSTRACT

A method and elastic buffer circuit are provided for implementing low power, single master-slave elastic buffers in a network chip design to provide a continuous stream of data to multiple sinks from multiple sources, and a design structure on which the subject circuit resides. An elastic buffer only uses a single master-slave register. The circuit includes a finite state machine, and a latch control block (LCB) to implement the single master-slave elastic buffer removing all ½ cycle paths between buffer locations enabling usage of the single master-slave register.

17 Claims, 8 Drawing Sheets

PRIOR ART

500

| STATE 502 | VI RI 504 | NEXT STATE 506 C1 C2 | VO RO 508 | NEXT STATE ENABLES 510 LCLK DLCLK |
|---|---|---|---|---|
| 0 0 | 0 0 | 0 0 | 0 1 | 0 1 |
|  | 0 1 | 0 0 | 0 1 | 0 1 |
|  | 1 0 | 0 1 | 0 1 | 1 1 |
|  | 1 1 | 0 1 | 0 1 | 1 1 |
| 0 1 | 0 0 | 0 1 | 1 1 | 0 1 |
|  | 0 1 | 0 0 | 1 1 | 0 1 |
|  | 1 0 | 1 1 | 1 1 | 0 0 |
|  | 1 1 | 0 1 | 1 1 | 1 1 |
| 1 1 | 0 0 | 1 1 | 1 0 | 0 0 |
|  | 0 1 | 0 1 | 1 0 | 1 1 |
|  | 1 0 | 1 1 | 1 0 | 0 0 |
|  | 1 1 | 0 1 | 1 0 | 1 1 |

FIG. 5

IMPLEMENTING LOW POWER, SINGLE MASTER-SLAVE ELASTIC BUFFER

STATEMENT REGARDING FEDERALLY SPONSORED RESEARCH OR DEVELOPMENT

This invention was made with Government support under Contract No. H98230-11-D0142/0003 awarded by the United States of America. The Government has certain rights in this invention.

FIELD OF THE INVENTION

The present invention relates generally to the data processing field, and more particularly, relates to a method and elastic buffer circuit for implementing low power, single master-slave elastic buffers in a network chip design to provide a continuous stream of data to multiple sinks from multiple sources, and a design structure on which the subject circuit resides.

DESCRIPTION OF THE RELATED ART

In a state of the art network communications system, a traditional elastic buffer makes use of two master-slave registers and a multiplexer (MUX) to provide a means to storing and sending data from storage buffer to storage buffer. Having two storage locations in each buffer allows for the network to continue to source data even if the downstream recipients are busy or supply data even when upstream sources are not ready. The elastic buffer is intended to remove bubbles in the data stream and keep the sources and sinks at their maximum use condition.

A need exists for an enhanced mechanism to enable an effective elastic buffer, which uses only a single master-slave register in a network in a chip design to provide a continuous stream of data to multiple sinks from multiple sources.

As used in the following description and claims, the term ½ cycle path should be understood to include a path where the receiving circuit requires valid data for half of the clock cycle. A typical case of this is a clock gate as illustrated in FIG. 1B. The path that generates an enable signal ENABLE would be a ½ cycle path or half cycle path, ENABLE must be valid during the entire time the CLK signal is active.

SUMMARY OF THE INVENTION

Principal aspects of the present invention are to provide a method and elastic buffer circuit for implementing low power, single master-slave elastic buffer in a network chip design to provide a continuous stream of data to multiple sinks from multiple sources, and a design structure on which the subject circuit resides. Other important aspects of the present invention are to provide such method, circuit and design structure substantially without negative effects and that overcome many of the disadvantages of prior art arrangements.

In brief, a method and elastic buffer circuit are provided for implementing low power, single master-slave elastic buffers in a network chip design to provide a continuous stream of data to multiple sinks from multiple sources, and a design structure on which the subject circuit resides. An elastic buffer only uses a single master-slave register. The circuit includes a finite state machine, and a latch control block (LCB) to implement the single master-slave elastic buffer removing all ½ cycle paths between buffer locations enabling no increase in the number of elastic buffers needed to implement the network chip design.

In accordance with features of the invention, no paths of the ½ cycle path type exist in the present invention between elastic buffer stages. Removing the ½ cycle paths allows the buffer stages to be placed at the maximum distance apart, reducing the total latch count, power and circuit area.

In accordance with features of the invention, key to removing the ½ cycle paths between buffer nodes is configuring the latch control block logic for the next state of the state diagram, and also providing the needed clock enables for the next state and not the current state based on the state machine outputs. All next state signals must be valid at the end of the launch-capture cycle.

In accordance with features of the invention, the finite state machine and corresponding logic are arranged such that only valid data can be passed through the data buffer.

In accordance with features of the invention, the finite state machine and corresponding logic only switches output data when new valid data become available. Removal of the invalid data bubbles is a key consideration to reduce network switching power.

BRIEF DESCRIPTION OF THE DRAWINGS

The present invention together with the above and other objects and advantages may best be understood from the following detailed description of the preferred embodiments of the invention illustrated in the drawings, wherein:

FIG. 5 is a state diagram of the finite state machine of the example elastic buffer of FIG. 4 in accordance with the preferred embodiments;

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method, and elastic buffer circuit are provided for implementing low power, single master-slave elastic buffer in a network chip design to provide a continuous stream of data to multiple sinks from multiple sources, and a design structure on which the subject circuit resides.

Figure 1A:
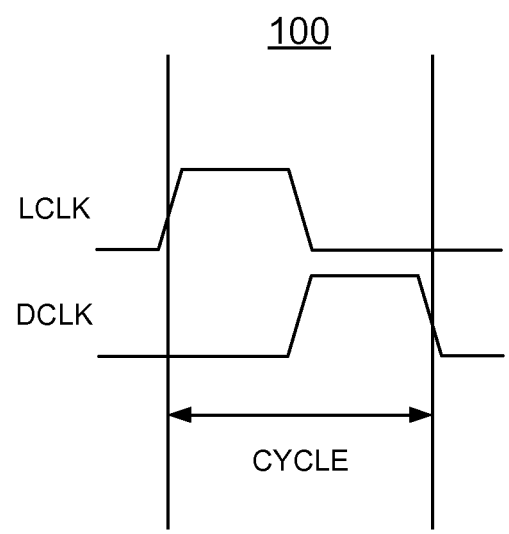
FIG. 1A illustrates an example latch control block (LCB) cycle that is defined as an LCLK-DCLK "Launch" of the slave (L2 latch) followed by a "Capture" of the downstream master (L1 latch) in accordance with the preferred embodiment.
Figure 1B:
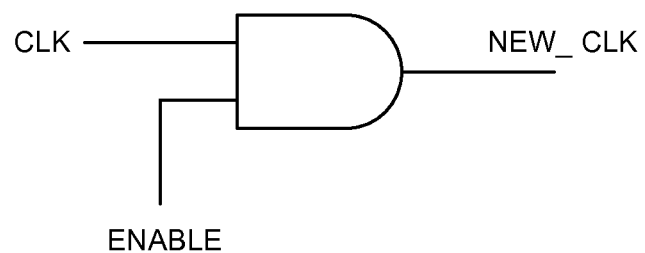
FIG. 1B illustrates a prior art clock gate with a half cycle path generating an enable signal applied to the clock gate.

Having reference now to the drawings, in FIG. 1, there is shown an example latch control block (LCB) cycle generally designated by the reference character 100 for implementing low power, single master-slave elastic buffers in a network chip design to provide a continuous stream of data to multiple sinks from multiple sources in accordance with the preferred embodiment.

The latch control block (LCB) cycle 100 is defined as an LCLK-DCLK "Launch" of the slave (L2 latch) followed by a "Capture" of the downstream master (L1 latch) in accordance with the preferred embodiment.

Figure 2:
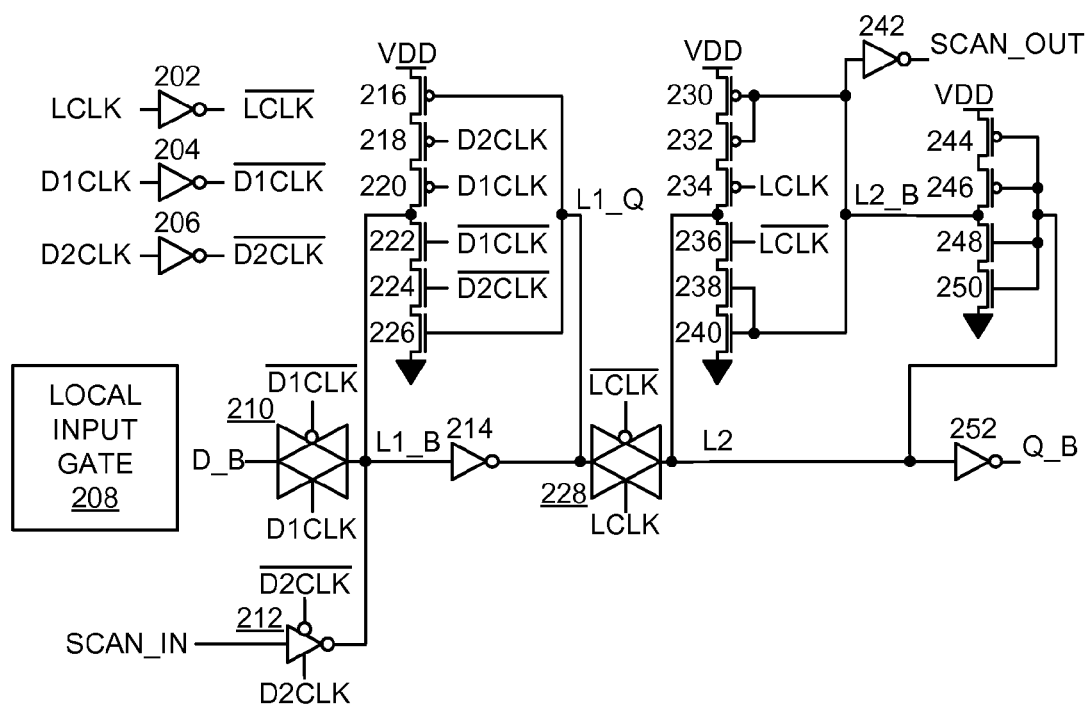
FIG. 2 is a schematic diagram of an example server style L1/L2 latch of a master (L1 latch) and a slave (L2 latch) in accordance with the preferred embodiment.
Figure 3:
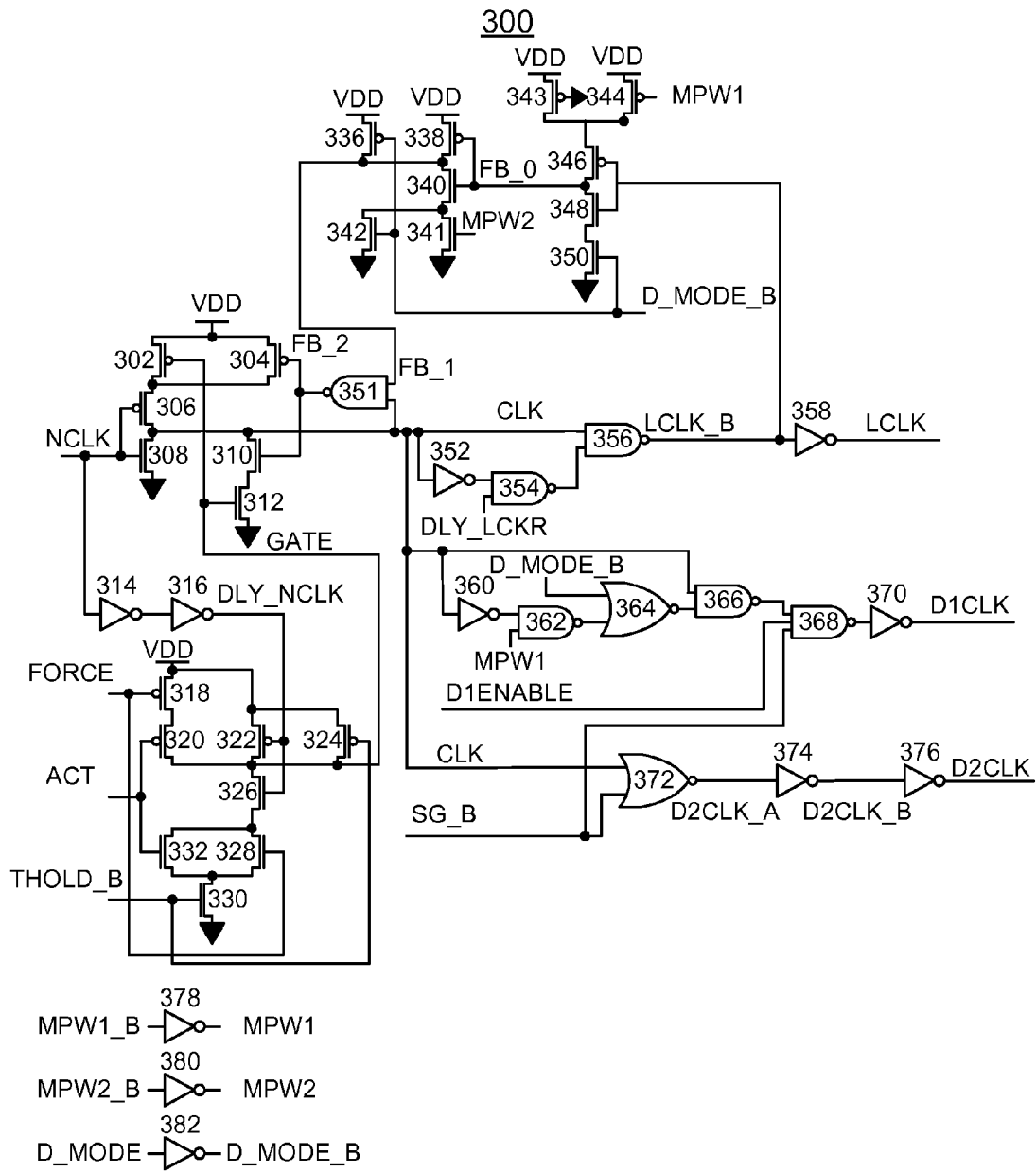
FIG. 3 is a schematic diagram of an example latch control block (LCB) in accordance with the preferred embodiment.

Referring to FIG. 2, there is shown an example server style L1/L2 latch generally designated by the reference character 200 of a master (L1 latch) and a slave (L2 latch) in accordance with the preferred embodiment. Master-slave L1/L2 latch 200 includes a plurality clocks LCLK, D1CLK, D2CLK, each shown with a respective inverter 202, 204, 206 providing inverted LCLK, D1CLK, D2CLK. The D1CLK AND LCLK are used in a functional mode. The D2CLK and LCLK are used in a scan mode. A latch control block (LCB), such as illustrated and described with respect to FIG. 3 provides the clocks LCLK, D1CLK, D2CLK.

In accordance with features of the invention, master-slave L1/L2 latch 200 is designed with an open transfer gate on the functional input and a local input gate is required that must be physically close to the latch and have sufficient strength to drive the latch input adequately. For the Elastic buffer this input will be an inverter.

Master-slave L1/L2 latch 200 includes a local input gate 208 coupled to a functional mode input 210 receiving clocks D1CLK, and inverted D1CLK inputs and a scan mode input SCAN_IN coupled to a scan mode input 212 receiving clocks D2CLK, and inverted D2CLK. The output L1_B of functional mode input 210 and the scan mode input 212 is applied to an inverter 214 providing an output L1_Q. Master-slave L1/L2 latch 200 includes a field effect transistor (FET) stack of P-channel field effect transistors (PFETs) 216, 218, 220 and N-channel field effect transistors (NFETs) 222, 224, 226 connected between a voltage supply rail VDD and ground potential. The output L1_B of functional mode input 210 and scan mode input 212 is applied to the series connection of PFET 220 and NFET 222. The inverted output L1_Q is applied to the gate input of PFET 216 and NFET 226. The respective clock D2CLK, and inverted D2CLK is applied to the respective gate input of PFET 218 and NFET 224. The respective clock D1CLK, and inverted D1CLK is applied to the respective gate input of PFET 220 and NFET 222.

The inverted output L1_Q is applied to L2 slave gate input 228 receiving clocks LCLK, and inverted LCLK and providing an output L2. L2 slave latch of master-slave L1/L2 latch 200 includes a first FET stack of PFETs 230, 232, 234 and NFETs 236, 238, 240 connected between the voltage supply rail VDD and ground potential. The output L2 of the L2 slave gate input 228 is applied to the series connection of PFET 234 and NFET 236. The clock LCLK, and inverted LCLK respectively is applied to the clock gate input of PFET 234 and NFET 236. The respective gates of PFETs 230, 232 and the respective gates of NFETs 238, 240 are connected together at node L2_B and applied to an inverter 242, which provides output SCAN_OUT of the master-slave L1/L2 latch 200. L2 slave latch of master-slave L1/L2 latch 200 includes a second FET stack of PFETs 244, 246 and NFETs 248, 250 connected between the voltage supply rail VDD and ground potential. The output L2_B is applied to the series connection of PFET 246 and NFET 248. The respective gates of PFETs 244, 246 and the respective gates of NFETs 248, 250 are connected together at node L2 and applied to an inverter 252, which provides output Q_B of the master-slave L1/L2 latch 200.

Referring to FIG. 3, there is shown an example latch control block (LCB) generally designated by the reference character 300 in accordance with the preferred embodiment. LCB 300 provides outputs of the clocks LCLK, D1CLK, D2CLK. LCB 300 includes an input at NCLK pin of a global system clock. The cycle begins when the NCLK falls from a logical "1" to a logical "0". LCB 300 includes an input control logic including a pair of parallel connected PFETs 302, 304 connected in series with a PFET 306 and NFET 308 between the voltage supply rail VDD and ground potential. A pair of series-connected NFETs 310, 312 is connected between the series connection of PFET 306 and NFET 308 and ground potential. The global system clock NCLK is applied to the gate of PFET 306 and NFET 308 and to an input of a pair of series connected inverters 314, 316 providing an output DLY_NCLK.

LCB 300 includes an input FORCE, ACT and THOLD_B, which are test control signals applied to test control logic including a pair of series connected PFETs 318, 320 connected in parallel with a pair of parallel connected PFETs 322, 324 and in series with series connected NFETs 326, 328, 330 connected between the voltage supply rail VDD and ground potential. An NFET 332 is connected in parallel with NFET 328. The test control signal FORCE is applied to the gate of PFET 318, and NFET 328. The test control signal ACT is applied to the gate of PFET 320, and NFET 332. LCB 300 includes timing adjust logic including a pair of parallel connected FETs 336, 338 connected in series with a pair of series connected NFETs 340, 341 connected between the voltage supply rail VDD and ground potential. An NFET 342 is connected in parallel with NFET 341. A transistor stack including a pair of parallel connected PFETS 343, 344 connected in series with series connected PFET 346, NFETs 348, 350 and connected between the voltage supply rail VDD and ground potential and includes a connection at node FB_0 between the series connection of PFET 346 and NFET 348 and the common connection of gate of PFET 338 and gate of NFET 340.

Signals MPW1 and MPW2 used to adjust the clock timing for diagnostics are respectively applied to the respective gate of PFET 344 and the gate of NFET 341. A signal DMODE_B applied to the gate of PFET 336 and NFETs 342, 350 is used to put the latches into pulsed or clocked mode. A series connection of PFETs 336, 338 and NFET 340 at node FB_1 is applied to a first input of NAND gate 351 with an input control logic output clock signal at node CLK applied to a second input of NAND gate 351.

The clock signal at node CLK is applied to an inverter 352 providing an inverted output applied to NAND gate 354 with a signal DLY_LCKR applied to second input of NAND gate 354. The output of NAND gate 354 and the clock signal at node CLK are applied to a NAND gate 356 providing an inverter clock LCLK_B that is applied to the gate of PFET 346 and NFET 348 and applied to an inverter 358 providing output clock LCLK of LCB 300.

The clock signal at node CLK is applied to an inverter 360 providing an inverted output applied to NAND gate 362 with the signal MPW1 applied to second input of NAND gate 362. The output of NAND gate 362 and the signal D_MODE_B are applied to a NOR gate 364 providing an output applied to NAND gate 366 with the clock signal at node CLK applied to second input of NAND gate 366. The output of NAND gate 366 is applied to a three-input NAND gate 368 receiving other inputs of D1ENABLE and SG_B. The output of three-input NAND gate 368 is applied to an inverter 370 providing output clock D1CLK of the LCB 300.

The clock signal at node CLK is applied to a NOR gate 372 receiving a second input SG_B. NOR gate provides an output D2CLK_A applied to an inverter 374 providing an inverted output D2CLK_B applied to a second inverter 376. Inverter 376 provides output clock D2CLK of the LCB 300. As shown, LCB 300 includes a respective inverter 378, 380, 382 receives a respective input MPW1_B, MPW2_B, D_MODE, and provides a respective inverted output MPW1, MPW2, D_MODE_B.

In pulsed mode the LCB 300 holds the output D1CLK high and pulses the LCLK. This mode save the D2CLK switching power, but increased the hold time of the data inputs as determined by the pulse width of the LCLK. In clocked mode, the D1CLK and LCLK follow the shape of the global system clock NCLK input. When NCLK falls the L2 launches data by making the LCLK rise to a logical 1 and captures data by making the D1CLK fall to a logical 0. The SG_B pin is used to select between functional mode and scan mode. The D1ENABLE signal is a D1CLK gate and is a key capability to the LCB 300.

Figure 4:
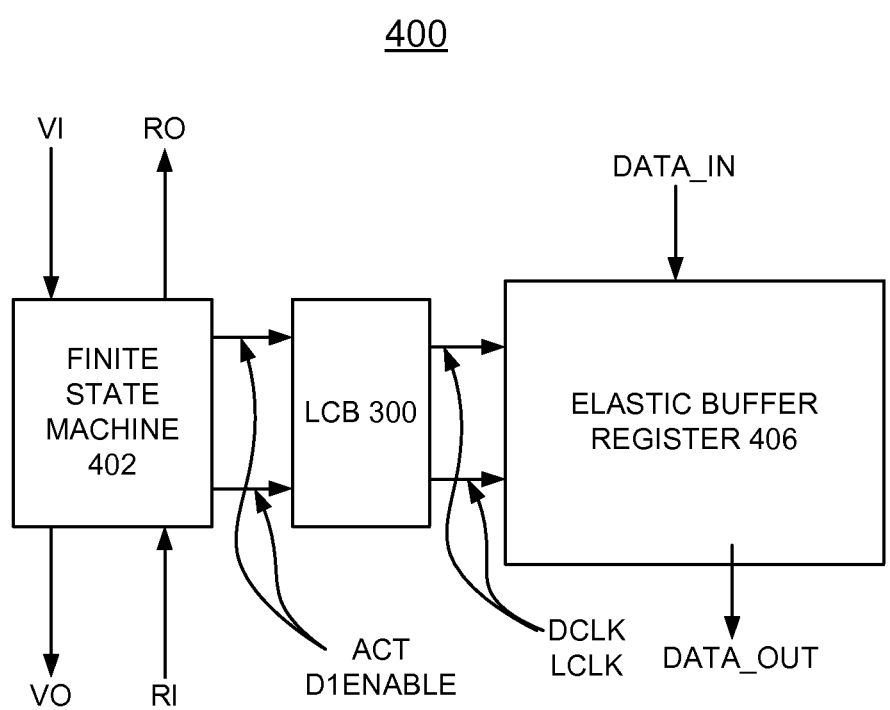
FIG. 4 is a schematic and block diagram of an example elastic buffer circuit in accordance with the preferred embodiment.

Referring to FIG. 4, there is shown an example elastic buffer generally designated by the reference character 400 in accordance with the preferred embodiment. Elastic buffer 400 includes a finite state machine 402, the LCB 300 and an elastic buffer register 406. As shown, the finite state machine 402 receives inputs Valid In (VI), Ready In (RI) signals and provides outputs Valid Out (VO), Ready Out (RO) signals. The finite state machine 402 provides inputs ACT and D1ENABLE to the LCB 300. The LCB 300 provides clock inputs DCLK, LCLK to the elastic buffer register 406, which receives a data input DATA_IN and provides a data output DATA_OUT.

The Elastic Buffer 400 assumes a Ready-Valid protocol. If the Valid In (VI) signal is a logical "1" the incoming data is valid. If the Ready In (RI) is a logical "1" the downstream buffer 406 is able to take new data. Valid Out (VO) signal is set to a logical "1" if the output buffer data is valid. The Ready Out (RO) signal is set to a logical "1" if the buffer has an available location to store data. Each buffer can accommodate two sets of data, one in the L1 latch and one in the L2 latch. The output always comes off the L2 latches, the input always goes into the L1 latches.

Figure 6:
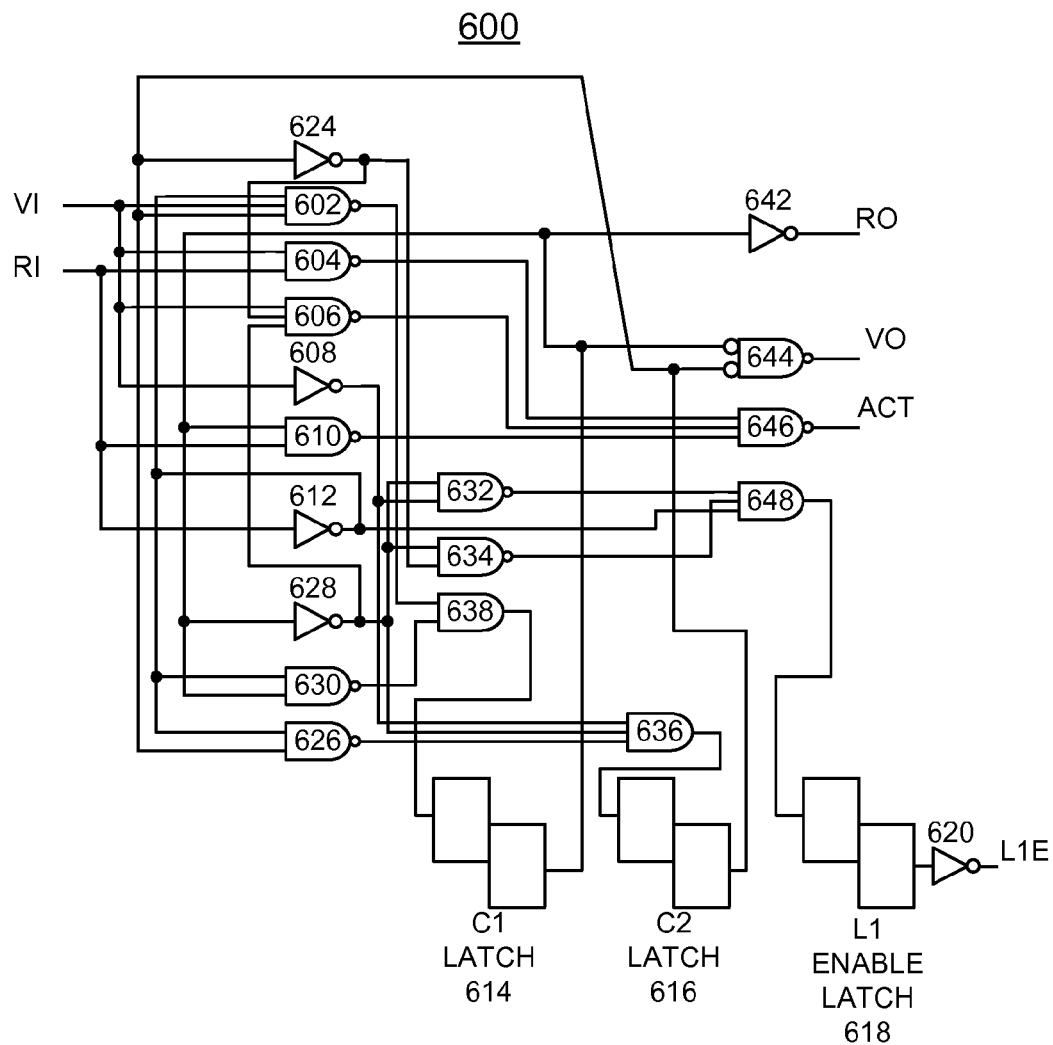
FIG. 6 is a schematic and block diagram of a logic implementation of the finite state machine of FIG. 5 and clocking control definitions of the example elastic buffer circuit of FIG. 4 in accordance with the preferred embodiment.

An example implementation for the finite state machine 402 for the disclosed Elastic Buffer 400 is illustrated and described with respect to FIGS. 5 and 6. Only three states are needed for this implementation, which requires two state latches, plus one additional latch for the L1CLK enable.

Referring to FIG. 5, there is shown a state diagram generally designated by the reference character 500 of the finite state machine of the example elastic buffer 400 in accordance with the preferred embodiments.

State diagram 500 includes three states 502 00, 01, 11, each state including four respective Valid In (VI), Ready In (RI) signals 504, next states 506, C1, C2, Valid Out (VO), Ready Out (RO) signals 508, and next state enables 510, LCLK, DLCLK, as shown.

Referring to FIG. 6, there is shown an example logic generally designated by the reference character 600 implementing the finite state machine and clocking control definitions of the example elastic buffer 400 in accordance with the preferred embodiment. Finite state machine and clocking control logic 600 receives the Valid In (VI) signal that is applied to a three input NAND gate 602 and a plurality of two input NAND gates 604, 606, and an inverter 608.

Finite state machine and clocking control logic 600 receives the Ready In (RI) signal that is applied to the two input NAND gates 604, another two input NAND gates 610, and an inverter 612. Finite state machine and clocking control logic 600 includes two state latches including latch C1 614, a C2 latch 616, and one additional latch L1 enable latch 618 for the L1CLK enable. An output of the L1 enable latch 618 is applied to an inverter 620 providing output L1E.

An output of the C2 latch 616 is applied to an inverter 624, the three input NAND gate 602, and a two input NAND gate 626. An output of the C1 latch 614 is applied to the two input NAND gate 610, an inverter 628 and a two input NAND gate 630. The output of inverter 628 is applied to the two input NAND gate 606, a pair of two input NAND gates 632, 634, and an AND gate 636, which provides an input to the C2 latch 616. An output of the NAND gate 630 is applied to an AND gate 638, which provides an input to the C1 latch 614. The output of the C1 latch 614 is applied to an inverter 642, which provides the Ready Out (RO) signal. The output of the C1 latch 614 is applied to a first inverting input of a two input NAND gate 644 and the output of the C2 latch 616 is applied to a second inverting input. The two input NAND gate 644 provides the Valid Out (VO) signal. A three input NAND gate 646 receiving the output of the respective NAND gates 604, 606, 610 provides the test control signal output ACT.

Figure 7:
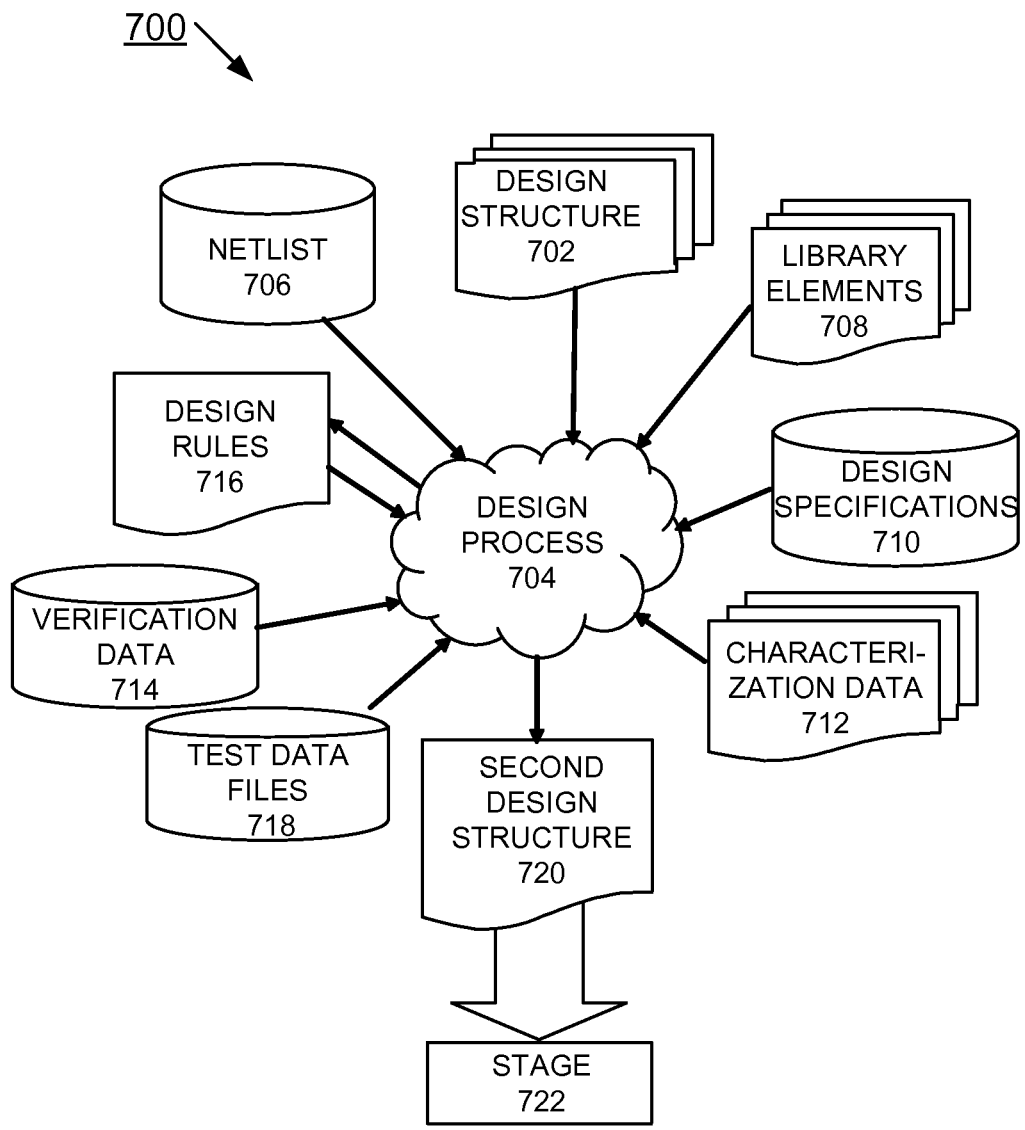
FIG. 7 is a flow diagram of a design process used in semiconductor design, manufacturing, and/or test.

FIG. 7 shows a block diagram of an example design flow 700. Design flow 700 may vary depending on the type of IC being designed. For example, a design flow 700 for building an application specific IC (ASIC) may differ from a design flow 700 for designing a standard component. Design structure 702 is preferably an input to a design process 704 and may come from an IP provider, a core developer, or other design company or may be generated by the operator of the design flow, or from other sources. Design structure 702 comprises circuit 200, 300, 400, 600 in the form of schematics or HDL, a hardware-description language, for example, Verilog, VHDL, C, and the like. Design structure 702 may be contained on one or more machine readable medium. For example, design structure 702 may be a text file or a graphical representation of circuit 100. Design process 704 preferably synthesizes, or translates, circuit 200, 300, 400, 600 into a netlist 706, where netlist 706 is, for example, a list of wires, transistors, logic gates, control circuits, I/O, models, etc. that describes the connections to other elements and circuits in an integrated circuit design and recorded on at least one of machine readable medium. This may be an iterative process in which netlist 706 is resynthesized one or more times depending on design specifications and parameters for the circuit.

Design process 704 may include using a variety of inputs; for example, inputs from library elements 708 which may house a set of commonly used elements, circuits, and devices, including models, layouts, and symbolic representations, for a given manufacturing technology, such as different technology nodes, 32 nm, 45 nm, 90 nm, and the like, design specifications 710, characterization data 712, verification data 714, design rules 716, and test data files 718, which may include test patterns and other testing information. Design process 704 may further include, for example, standard circuit design processes such as timing analysis, verification, design rule checking, place and route operations, and the like. One of ordinary skill in the art of integrated circuit design can appreciate the extent of possible electronic design automation tools and applications used in design process 704 without deviating from the scope and spirit of the invention. The design structure of the invention is not limited to any specific design flow.

Design process 704 preferably translates an embodiment of the invention as shown in FIGS. 2, 3, 4, 5, and 6 along with any additional integrated circuit design or data (if applicable), into a second design structure 720. Design structure 720 resides on a storage medium in a data format used for the exchange of layout data of integrated circuits, for example, information stored in a GDSII (GDS2), GL1, OASIS, or any other suitable format for storing such design structures. Design structure 720 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 2, 3, 4, 5, and 6. Design structure 720 may then proceed to a stage 722 where, for example, design structure 720 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A circuit for implementing low power, single master-slave elastic buffers in a network chip design to provide a continuous stream of data to multiple sinks from multiple sources comprising:
an elastic buffer including
a single master-slave register;
a latch control block (LCB) coupled to single master-slave register;
a finite state machine coupled to said latch control block (LCB);
said finite state machine and said LCB removing all ½ cycle paths between buffer locations enabling usage of the single master-slave register; and
a Ready-Valid protocol, said finite state machine receiving a Valid In (VI) signal of a logical one indicating valid incoming data, and a Ready In (RI) of a logical one indicating downstream buffer being available for new data.

2. The circuit as recited in claim 1 wherein said LCB includes logic for configuring a next state of the state diagram, and providing the predefined clock enables for a next state and not the current state based on the state machine outputs.

3. The circuit as recited in claim 1 wherein said finite state machine and said LCB are arranged for providing valid next state signals at an end of a launch-capture cycle.

4. The circuit as recited in claim 1 wherein said finite state machine and said LCB are arranged to pass only valid data through said single master-slave register.

5. The circuit as recited in claim 1 wherein said finite state machine and said LCB are arranged to only switch output data when new valid data becomes available.

6. The circuit as recited in claim 1 includes a global system clock, said global system clock falling from a logical one to a logical zero to start a launch-capture cycle.

7. The circuit as recited in claim 1 includes a Valid Out signal of a logical one indicating valid output buffer data, and a Ready Out signal of a logical one indicating an available buffer location to store data.

8. A design structure embodied in a non-tangible machine readable medium used in a design process, the design structure comprising:
a circuit tangibly embodied in the non-tangible machine readable medium used in the design process, said circuit for implementing low power, single master-slave elastic buffers in a network chip design to provide a continuous stream of data to multiple sinks from multiple sources, said circuit comprising:
an elastic buffer including
a single master-slave register;
a latch control block (LCB) coupled to single master-slave register;
a finite state machine coupled to said latch control block (LCB);
said finite state machine and said LCB removing all ½ cycle paths between buffer locations enabling usage of the single master-slave register, and
a Ready-Valid protocol, said finite state machine receiving a Valid In (VI) signal of a logical one indicating valid incoming data, and a Ready In (RI) of a logical one indicating downstream buffer being available for new data, wherein the design structure, when read and used in the manufacture of a semiconductor chip produces a chip comprising said circuit.

9. The design structure of claim 8, wherein the design structure comprises a netlist, which describes said circuit.

10. The design structure of claim 8, wherein the design structure resides on storage medium as a data format used for the exchange of layout data of integrated circuits.

11. The design structure of claim 8, wherein the design structure includes at least one of test data files, characterization data, verification data, or design specifications.

12. The design structure of claim 8, includes a Valid Out signal of a logical one indicating valid output buffer data, and a Ready Out signal of a logical one indicating an available buffer location to store data.

13. A method implementing low power, single master-slave elastic buffers in a network chip design to provide a continuous stream of data to multiple sinks from multiple sources comprising:
providing an elastic buffer including a single master-slave register; a latch control block (LCB) coupled to single master-slave register; a finite state machine coupled to said latch control block (LCB);
arranging said finite state machine and said LCB for removing all ½ cycle paths between buffer locations enabling usage of the single master-slave register; and
implementing a Ready-Valid protocol, said finite state machine receiving a Valid In (VI) signal of a logical one indicating valid incoming data, and a Ready In (RI) of a logical one indicating downstream buffer being available for new data.

14. The method as recited in claim 13 includes arranging said finite state machine and said LCB for providing valid next state signals at an end of a launch-capture cycle.

15. The method as recited in claim 13 includes providing said finite state machine and said LCB being arranged to pass only valid data through said single master-slave register.

16. The method as recited in claim 13 includes providing a global system clock, said global system clock falling from a logical one to a logical zero to start a launch-capture cycle.

17. The method as recited in claim 13 includes providing a Valid Out signal of a logical one indicating valid output buffer data, and a Ready Out signal of a logical one indicating an available buffer location to store data.

\* \* \* \* \*